United States Patent
Tomita

(10) Patent No.: US 8,456,614 B2
(45) Date of Patent: Jun. 4, 2013

(54) OPTICAL ELEMENT SUPPORTING DEVICE, EXPOSURE APPARATUS USING SAME, AND DEVICE MANUFACTURING METHOD

(75) Inventor: Hiroyuki Tomita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 460 days.

(21) Appl. No.: 12/608,796

(22) Filed: Oct. 29, 2009

(65) Prior Publication Data

US 2010/0110404 A1 May 6, 2010

(30) Foreign Application Priority Data

Oct. 30, 2008 (JP) ................. 2008-279652

(51) Int. Cl.
*G02B 7/02* (2006.01)
*G03B 27/42* (2006.01)
*G03B 27/52* (2006.01)
*G03B 27/54* (2006.01)

(52) U.S. Cl.
USPC .............. 355/67; 355/53; 355/55; 359/819; 359/823

(58) Field of Classification Search
USPC ............... 355/53, 55, 67; 359/811, 813–814, 359/818–819, 822–830
See application file for complete search history.

(56) References Cited

U.S. PATENT DOCUMENTS

| 7,116,500 | B2 | 10/2006 | Murasato |
| 7,139,137 | B2 | 11/2006 | Sudoh |
| 2009/0244509 | A1* | 10/2009 | Limbach et al. ............ 355/67 |

FOREIGN PATENT DOCUMENTS

| JP | 2004-347821 | | 12/2004 |
| JP | 2006-113414 | A | 4/2006 |
| WO | WO 2008064859 | A2 * | 6/2008 |

* cited by examiner

*Primary Examiner* — Hung Henry Nguyen
*Assistant Examiner* — Colin Kreutzer
(74) *Attorney, Agent, or Firm* — Canon USA Inc IP Division

(57) ABSTRACT

The optical element supporting device of the present invention includes a first supporting member that supports the optical element, a second supporting member that supports the first supporting member at a plurality of locations, a plate spring fastened to the first supporting member and having a plate thickness extending in the optical axis direction of the optical element, and a force supplying unit, which is provided on the first supporting member, configured to provide a force in the optical axis direction applied to the plate spring at a location different from the plurality of locations, wherein the force supplying unit elastically deforms the first supporting member by receiving the reactive force generated by the force applied to the plate spring to thereby adjust the position of the optical element.

13 Claims, 4 Drawing Sheets

OPTICAL ELEMENT SUPPORTING DEVICE, EXPOSURE APPARATUS USING SAME, AND DEVICE MANUFACTURING METHOD

BACKGROUND OF THE INVENTION

1. Field of the Invention

The present invention relates to an optical element supporting device for precisely adjusting the position of an optical element such as a lens or mirror, an exposure apparatus using the same, and a device manufacturing method.

2. Description of the Related Art

A semiconductor exposure apparatus is an apparatus for transferring a circuit pattern of an original (reticle) onto a substrate (silicon wafer). When a circuit pattern is transferred, a projection optical system that serves as an optical device is used in order to focus a reticle pattern on a wafer. To prepare a highly integrated circuit, high-resolution performance is required for the projection optical system.

In order to enhance the resolution performance of the projection optical system, it is necessary to increase the numerical aperture (NA) of the optical system as well as to reduce the optical aberration severely. However, when a lens constituting the optical system is eccentric with respect to an optical axis, astigmatism, coma aberration, or eccentric distortion occurs. Accordingly, in recent years, an apparatus for adjusting the position of a lens has been proposed in order to correct these aberrations.

For example, the adjustment mechanism disclosed in Japanese Patent Laid-Open No. 2004-347821 adjusts the position of an optical member by holding a support member that supports an optical element with an elastic member and applying a force to the elastic member through a force supplying unit.

However, in the conventional adjustment mechanism as disclosed in Japanese Patent Laid-Open No. 2004-347821, a mechanism for adjusting the position of an optical member is large, which may lead to increase the size of a lens barrel constituting the projection optical system. Furthermore, the production cost may increase because of the complex shape of the elastic member.

SUMMARY OF THE INVENTION

In view of these circumstances, the present invention provides an optical element supporting device that is capable of changing the position of an optical element with high accuracy in a space-saving and cost-effective way. Furthermore, the present invention provides a method for manufacturing a semiconductor device or the like by an exposure apparatus wherein an optical device such as an exposure apparatus having less optical aberration is configured using the supporting device.

According to an aspect of the present invention, a supporting device that supports an optical element, has a first supporting member that supports the optical element, a second supporting member that supports the first supporting member at a plurality of locations, a plate spring fastened to the first supporting member, and having a plate thickness extending in the optical axis direction of the optical element, and a force supplying unit, which is provided on the first supporting member, configured to provide a force in the optical axis direction applied to the plate spring at a location different from the plurality of locations, wherein the force supplying unit elastically deforms the first supporting member by receiving the reactive force generated by the force applied to the plate spring to thereby adjust the position of the optical element.

The present invention produces the following effects. More specifically, the optical element supporting device of the present invention can correct the position of an optical element with high accuracy in a space-saving and cost-effective way. Therefore, an optical device having high resolution performance can be provided by employing the optical element supporting device of the present invention. Furthermore, the supporting device of the present invention can correct the position of an optical element with high accuracy, which enables providing a high-performance semiconductor exposure apparatus and manufacturing a high-quality semiconductor device.

Further features of the present invention will become apparent from the following description of exemplary embodiments with reference to the attached drawings.

DESCRIPTION OF THE EMBODIMENTS

Hereinafter, embodiments of the present invention will now be described with reference to the accompanying drawings.

(Optical Element Supporting Device)

Figure 1:
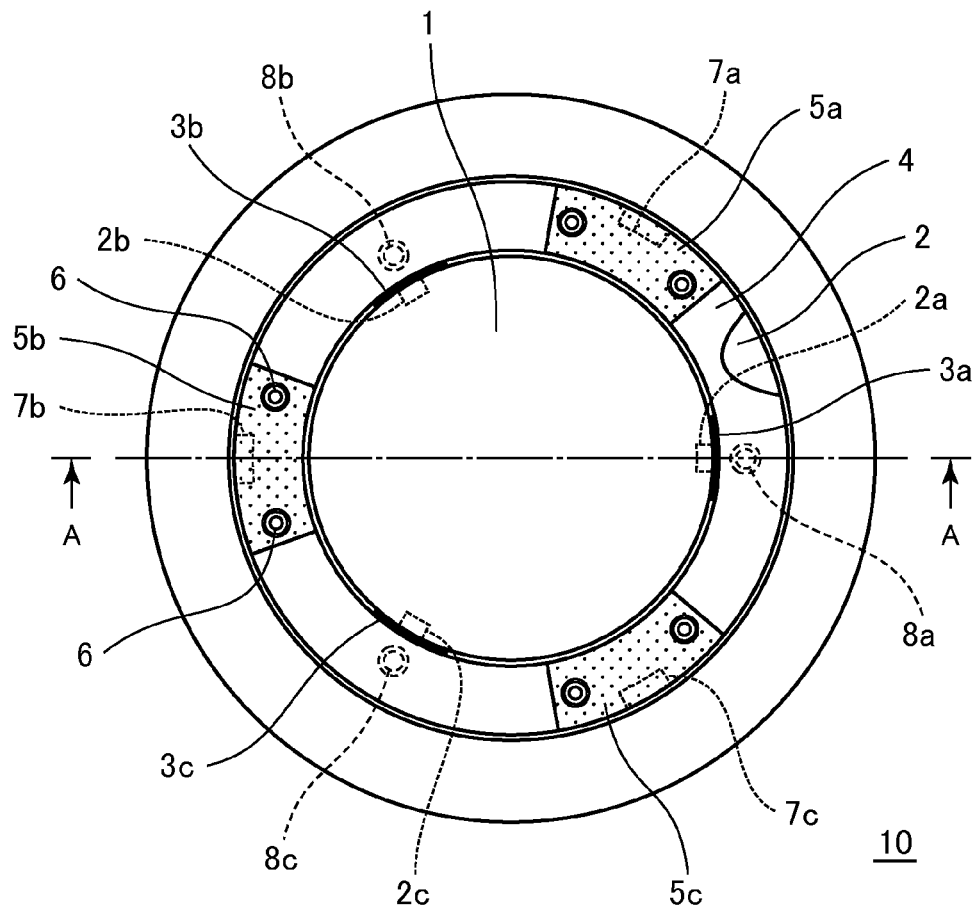
FIG. 1 is a schematic view (top view) showing the configuration of the optical element supporting device of the present invention.
Figure 2:
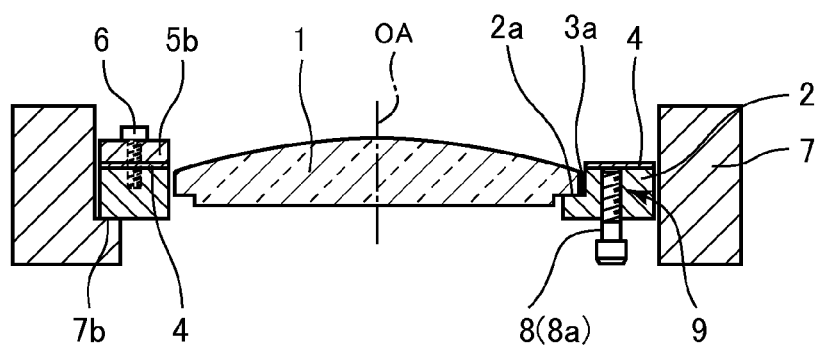
FIG. 2 is a schematic view (sectional view) showing the configuration of the optical element supporting device of the present invention.

Each of FIGS. 1 and 2 is a schematic view showing the configuration of an optical element supporting device according to an embodiment of the present invention.

Here, FIG. 1 is a top view from the optical axis direction of the optical element, and FIG. 2 is a sectional view taken along the line A-A in FIG. 1. An optical element supporting device 10 of the present invention includes an optical element 1, a first supporting member 2, a second supporting member 7, a plate spring 4, and an adjustment screw 8.

The optical element 1 is an optical element such as a lens or mirror. In the present embodiment, the optical element 1 is a lens. Preferable materials of the lens include a quartz glass or fluorite glass.

The first supporting member 2 is an annular member that supports the optical element 1 on the inner diameter side thereof. At the inner diameter side of the first supporting member 2, first supports 2a, 2b, and 2c are equiangularly arranged at three locations in the circumferential direction of the first supporting member 2 so as to accommodate the outer diameter portion of the optical element 1. The optical element 1 is held in contact with the first supports 2a, 2b, and 2c. The optical element 1 performs the positioning in the optical axis (OA) direction and is joined to the first supporting member 2 by joining members 3a, 3b, and 3c provided at three locations.

Preferable materials for the first supporting member 2 include carbon steel, stainless steel, a nickel alloy such as invar, aluminum alloy, a copper alloy such as brass, or cordierite system, alumina, or ceramic material such as silicon nitride. Those having a function serving as the elastic body are used.

The second supporting member 7 is a cylindrical member that supports the first supporting member 2 at the inner diameter side. At the inner diameter side of the second supporting member 7, second supports 7a, 7b, and 7c are equiangularly arranged in the circumferential direction at three angular positions that differ from those of the first supports 2a, 2b, and 2c provided with the first supporting member 2. The first supporting member 2 is held in contact with the second support 7a, 7b, and 7c. Materials for the second supporting member 7 include iron material, preferably an alloy such as 18-8 stainless steel.

The plate spring (force receiving unit) 4 is an annular elastic member. The plate spring 4 is fixed to the first supporting member 2 by fastening plate spring holders 5a, 5b, and 5c made of block bodies with fastening screws 6 at evenly spaced locations in the circumferential direction.

Preferable materials for the plate spring 4 include spring materials such as stainless steel for a spring or phosphor bronze for a spring.

The adjustment screws 8 (8a, 8b, and 8c) are screw-engaged to taps 9 (9a, 9b, and 9c) formed in the first supporting member 2, and each of those is rotatably adjustable. Preferable mounting locations of the adjustment screws 8a, 8b, and 8c are in the vicinity of the first supports 2a, 2b, and 2c, respectively.

Figure 3:
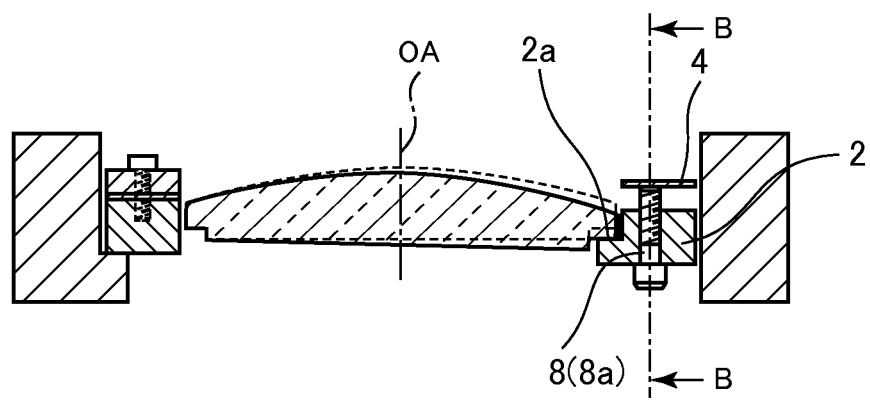
FIG. 3 is a schematic view showing the operation of the optical element supporting device of the present invention.
Figure 4:
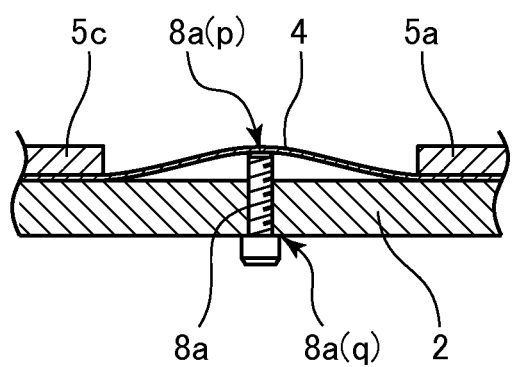
FIG. 4 is a schematic view showing the operation of the optical element supporting device of the present invention.

Next, the operation of the optical element supporting device 10 will be described. FIG. 3 is a schematic view showing when the adjustment screw 8a is rotated in the sectional view of FIG. 2. FIG. 4 is a sectional view taken along the line B-B in FIG. 3. The explanation hereinafter will be given for the case in which the position of the optical element 1 may be adjusted on the assumption that the initial installation of the optical element 1 or the time-lapse change of the position of the optical element 1 has been carried out.

The position adjustment of the optical element 1 is performed by the appropriate rotation of the adjustment screw 8a by the operator. Due to the rotation of the adjustment screw 8a, the tip 8a(p) of the adjustment screw 8a moves upward in the optical axis direction with respect to the first supporting member 2 to thereby push the plate spring 4 upwardly.

In the optical axis direction of the optical element 1, the spring constant of the first supporting member 2 is given as K1, the spring constant of the plate spring 4 is given as K2, the displacement of the first supporting member 2 is given as Z1, and the displacement of the plate spring 4 is given as Z2. In such cases, the load $F1=K1\times Z1$ is applied downwards to the first supporting member 2, and the load $F2=K2\times Z2$ is applied upwards to the plate spring 4. The load F1 and the load F2 are equal, and the amount of movement of the adjustment screw 8a with respect to the first supporting member 2 is the sum of Z1 and Z2.

Next, since the plate spring 4 has a plate thickness extending in the optical axis direction and is fixed to the opposite ends of plate spring holders 5a and 5c, the plate spring 4 flexes between the plate spring holders 5a and 5c by receiving force from the adjustment screw 8a, resulting in the generation of reactive force downward with respect to the optical axis direction. Due to the reactive force generated by the plate spring 4, the adjustment screw 8a generates a displacement Z1 with respect to the first supporting member 2 downward with respect to the optical axis direction. The displacement Z1 causes a support 2a provided on the first supporting member 2 to move downward with respect to the optical axis direction. Therefore, as shown in FIG. 3, the optical element 1 held in the support 2a also inclines downward with respect to the optical axis direction, whereby the position of the optical element 1 can be adjusted.

In particular, when the spring constant K2 of the plate spring 4 is very small compared to the spring constant K1 of the first supporting member 2, the displacement Z1 of the first supporting member 2 becomes very small compared to the displacement Z2 of the plate spring 4, whereby the position adjustment of the optical element 1 can be performed with high accuracy. For example, to increase the amount of position adjustment of the optical element 1, the adjustment can made by decreasing the spring constant K1 or increasing the spring constant K2.

The adjustment screw 8 also has a stepped portion 8a(q) having a diameter greater than a threaded portion. The stepped portion 8a(q) is provided, which allows limiting the amount of movement of the adjustment screw 8 such that the amount of elastic deformation of the plate spring 4 and the first supporting member 2 does not exceed a predetermined amount. Therefore, the stepped portion 8a(q) can be the normal position of the adjustment screw 8. Since the adjustment screw 8 always receives the reactive force by the plate spring 4 downward with respect to the optical axis direction, the adjustment screw 8 does not move over time by itself.

Likewise, by the rotation adjustment of the other two adjustment screws 8b and 8c, the optical element 1 can be inclined to other orientations.

As explained in the foregoing, in combination with each of the amounts of adjustment of all three adjustment screws 8a, 8b, and 8c, the optical element 1 can be inclined in any orientation in any amount, whereby the optical element 1 can be moved in the optical axis direction as appropriate. With this arrangement, the position of the optical element 1 can be adjusted in a desired position.

(Optical System)

Figure 5:
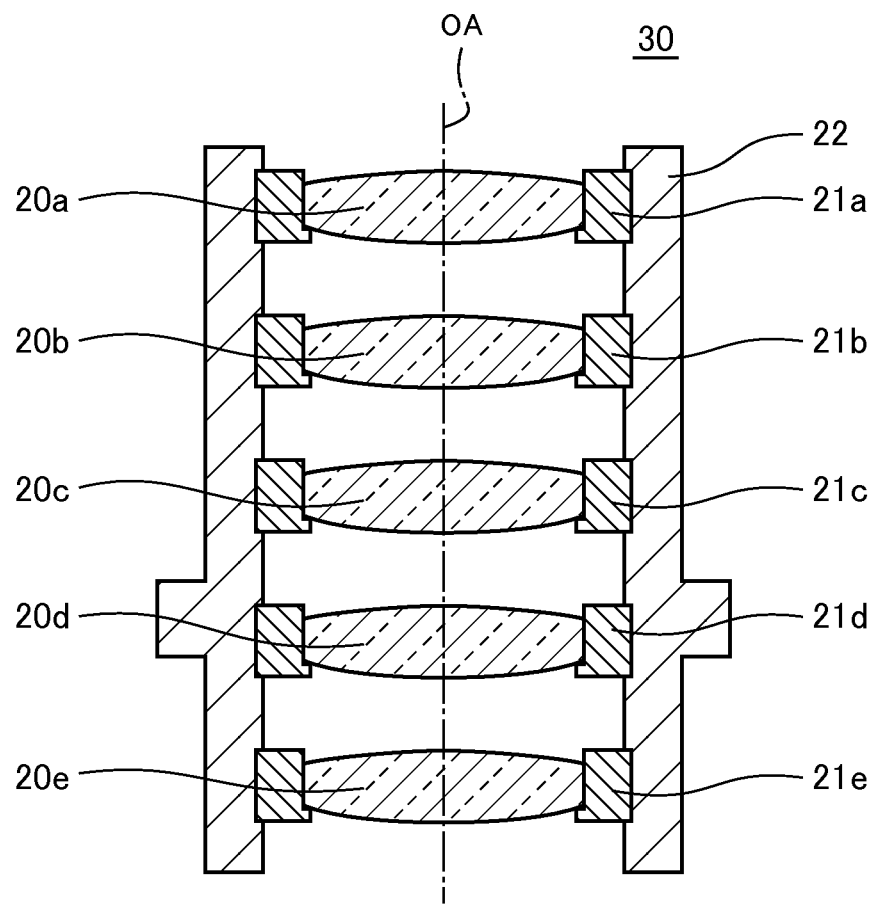
FIG. 5 is a schematic view showing the configuration of an optical system to which the optical element supporting device of the present invention is applied.

FIG. 5 is a schematic view showing the configuration of an optical system 30 to which the optical element supporting device 10 of the present invention is applied. The optical system 30 includes optical elements 20a to 20e, first supporting members 21a to 21e, and a second supporting member 22.

The optical element supporting device 10 of the present invention is applied to at least one of the optical elements 20a to 20e. Various members that are applicable to the optical elements 20a to 20e and the first supporting members 21a to 21e have the same configurations as those in the above-described embodiment, and explanation thereof will be omitted. The second supporting member 22 is integrally formed with successive cylindrical members, each of which is the second supporting member 7 of the above-described embodiment. Although the second supporting member 22 has an integral cylindrical shape in FIG. 5, the second supporting member 22 may be split and combined together as in the above-described embodiment as required.

Figure 6:
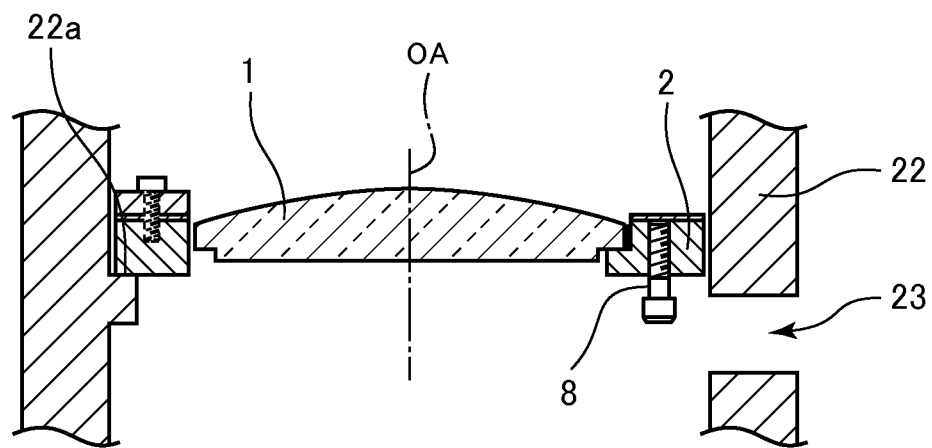
FIG. 6 is a partially enlarged schematic view of the optical system shown in FIG. 5.

FIG. 6 is a partially enlarged schematic view of the optical system 30 to which the optical element supporting device 10 according to the above-described embodiment is applied as shown in FIG. 5. The same components as those in the above-described embodiment are designated by the same reference numerals and explanation thereof will be omitted. The second supporting member 22 supports the first supporting member 2 as in the second supporting member 7 according to the above-described embodiment.

Here, the second supporting member 22 has an opening 23 in the vicinity of the adjustment screw 8. The operator measures the optical performance of the optical system 30 in FIG. 5 by a predetermined means, and adjusts the position of the optical element 1 by the appropriate rotation of the adjustment screw 8 based on the result to attain a desired optical performance. The opening 23 is desirably located in a position best suited for rotating the adjustment screw 8.

(Exposure Apparatus)

Figure 7:
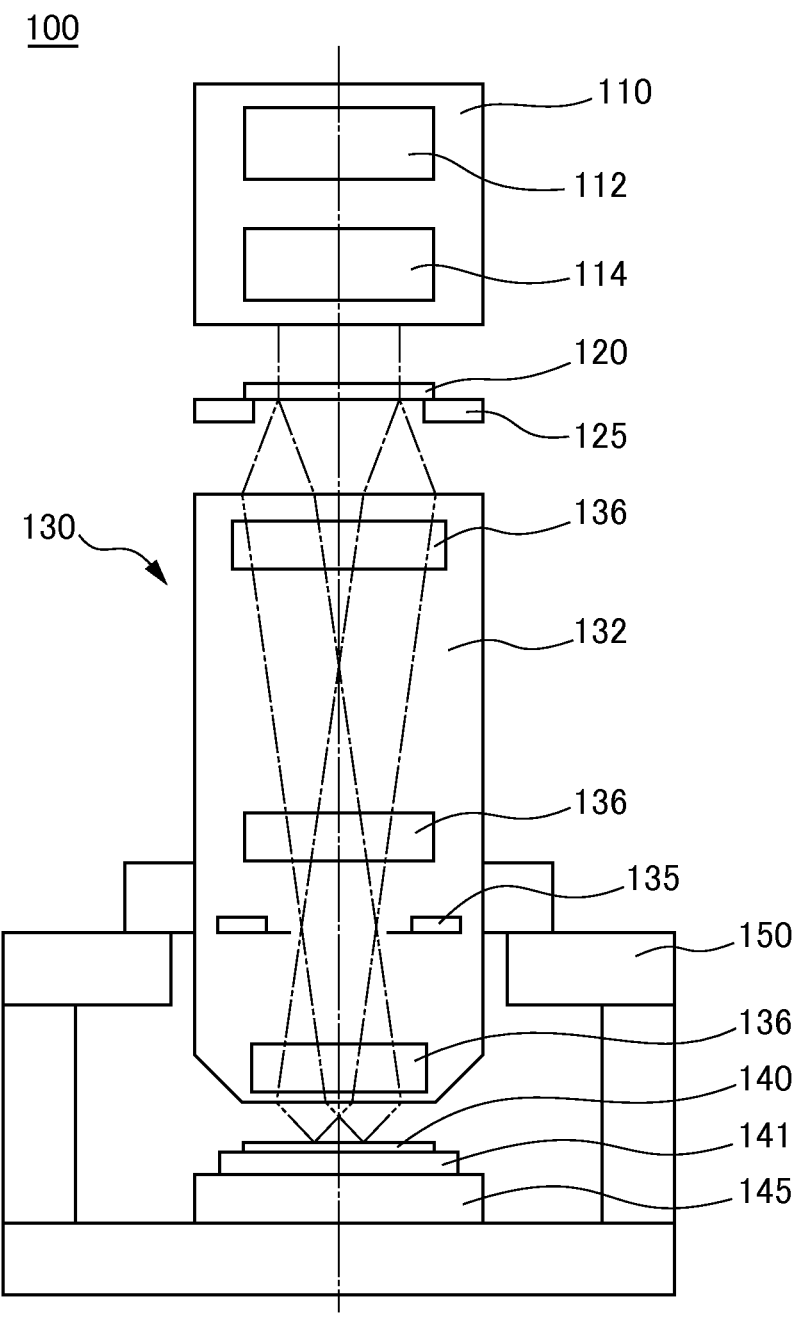
FIG. 7 is a schematic view showing the configuration of an exposure apparatus to which the optical element supporting device of the present invention is applied.

FIG. 7 is a schematic view showing the configuration of an exposure apparatus 100 to which the optical element supporting device 10 of the present invention is applied. The exposure apparatus 100 includes an illumination device 110, an original (reticle) 120, a projection optical system 130, a substrate 140, and a substrate stage 145.

Note that the exposure apparatus 100 according to the present embodiment is a scanning projection exposure apparatus that exposes a circuit pattern formed on the original 120 onto the substrate 140 employing a step-and-repeat system or a step-and-scan system.

The illumination device 110 includes a light source portion 112 and an illumination optical system 114, and is a device that illuminates the original 120 on which a transfer circuit pattern is formed.

At the light source portion 112, the light source uses a laser, for example. The available laser includes an ArF excimer laser with a wavelength of about 193 nm, a KrF excimer laser with a wavelength of about 248 nm, a F2 excimer laser with a wavelength of about 157 nm, and the like. The type of laser is not limited to an excimer laser, and for example, a YAG laser may also be used. The number of lasers is also not limited. In addition, when the light source portion 112 utilizes a laser, a light beam shaping optical system that shapes a parallel light flux from the laser light source into a desired beam shape or an incoherent optical system that makes a coherent laser incoherent is preferably used. Furthermore, a light source available for the light source portion 112 is not limited to a laser, but a single or a plurality of lamps such as mercury lamp or xenon lamp may also be used.

The illumination optical system 114 is an optical system that illuminates the original 120. The optical system includes a lens, a mirror, a light integrator, a stop, and the like. In general, the optical system is aligned in the order of a condenser lens, a fly-eye lens, an aperture stop, a condenser lens, a slit, and an imaging optical system. The illumination optical system 114 can be used for both on-axis light and off-axis light. The light integrator includes an integrator constructed by overlying a fly-eye lens or two pairs of cylindrical lens array sheets. Note that the light integrator may be replaced with an optical rod or a diffractive element. Also, an aperture stop is arranged as a circular stop, an annular illumination stop for deformed illumination, a quadrupole illumination stop, and the like.

The original 120 is made of quartz glass, for example. A circuit pattern to be transferred is formed on the original 120. In the present embodiment, the original 120 is fixed to a reticle chuck (not shown) provided on the center of a rectangular reticle stage 125.

The projection optical system 130 projects and exposes a pattern in the original 120, which is illuminated with exposure light from the illumination optical system 114, onto the substrate 140 with a predetermined magnification (e.g., ¼ or ⅕). As the projection optical system 130, an optical system consisting only of a plurality of optical elements or an optical system (catadioptric optical system) consisting of a plurality of optical elements and at least one concave mirror can be employed. Alternatively, as the projection optical system 130, an optical system consisting of a plurality of optical elements and at least one diffractive optical element such as a kinoform, an entire mirror type optical system, or the like can also be employed.

In addition, the projection optical system 130 includes an optical element (not shown) disposed within the projection optical system 130, an optical stop apparatus 135, a supporting device 136 of the optical element according to the above-described embodiment, and a lens barrel 132.

At least one or more of the optical element supporting devices 136 are provided. For example, three supporting devices are provided as shown in FIG. 7, each of which is used for the adjustment of the position of an optical element that is sensitive to astigmatism, coma aberration, eccentric distortion, and the like. As a result, aberration is reduced to an extremely low level, and an exposure apparatus having high resolution performance can thereby be provided.

The substrate 140 is a target to be processed such as a silicon wafer or a glass plate for liquid crystal substrate. A resist (photosensitizer) is applied on the surface thereof. The substrate stage 145 is a stage for fixing the substrate 140 via a plate chuck 141. The substrate stage 145 is held on a base frame 150 together with the projection optical system 130.

In the exposure apparatus 100 according to the present embodiment, the diffracted light generated from the original 120 passes through the projection optical system 130 and is projected on the substrate 140. The substrate 140 is in a conjugated relationship with the original 120. In the case of a scanning type projection exposure apparatus, the pattern of the original 120 is transferred onto the substrate 140 by scanning the original 120 and the substrate 140. In the case of a stepper (step-and-repeat type exposure apparatus), exposure is performed while the original 120 and the substrate 140 are held stationary.

(Device Manufacturing Method)

Next, an embodiment of a method of manufacturing a device utilizing the above-mentioned exposure apparatus will be described.

A device such as a semiconductor element, liquid crystal display element, image sensor (e.g., CCD), thin film magnetic head, or the like is manufactured by an exposure step which exposes a substrate, on which a resist is applied, using the exposure apparatus described above; a developing step which develops the substrate exposed in the exposure step; and other known steps. Examples of such known steps include at least one step selected from oxidizing, depositing, vapor depositing, doping, planarization, etching, resist removal, dicing, bonding, packaging, and the like.

Although the foregoing embodiment has been described for the case in which a lens is used as an optical element, the present invention is not particularly limited thereto. For example, a parallel and flat glass, mirror, prism, diffractive optical element, or the like may also be used as an optical element. In addition, an optical element, which is fixed to a holding frame (not shown) by adhesion, may be used in order to prevent deformation.

Although the foregoing embodiment has been described for the case in which an integrated plate spring is used as an elastic member, the plate spring may also be divided into three portions, each of which may be arranged such that both ends configured to serve as a spring are fixed to the first supporting member 2. In this case, the size of the plate spring can be reduced, which enables cost reduction and space-saving.

Although the foregoing embodiment has been described for the case in which the plate spring 4 is disposed on the top side of the first supporting member 2, the plate spring 4 may also be disposed on the underside of the first supporting member 2. In addition, although the foregoing embodiment has been described for the case in which a force supplying unit is arranged such that the adjustment screw 8 is moved with respect to the second supporting member 7 by the rotation of the adjustment screw 8 so as to apply a force to the second supporting member 7 and the plate spring 4, an actuator such as piezo actuator, ball screw drive, or the like may also be used, for example. Furthermore, although the foregoing embodiment has been described for the case in which joining members 3a, 3b, and 3c are used as a fixing unit configured to fix the optical element 1 to the first supporting member 2, a fixing unit is not limited thereto but any fixing unit such as a mechanical clamp may also be used.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-279652 filed Oct. 30, 2008 which is hereby incorporated by reference herein in its entirety.

What is claimed is:

1. A supporting device that supports an optical element, comprising:
   a first supporting member that includes an annular member arranged along an outer circumference of the optical element and provides a plurality of supports contacting with the optical element;
   a second supporting member that supports the first supporting member at a plurality of locations;
   a plate spring including a portion fastened to the first supporting member and a portion not fastened to the first supporting member in a direction along the outer circumference of the optical element, and having a plate thickness extending in the optical axis direction of the optical element; and
   a force supplying unit, which is provided on the first supporting member, configured to provide a force in the optical axis direction applied to the portion not fastened to the plate spring at a location different from the plurality of locations,
   wherein the first supporting member is configured to be elastically deformed by receiving the reactive force generated by the force that the force supplying unit supplies to the plate spring, the elastic deformation displacing at least one of a plurality of the supports in the optical axis direction.

2. The optical element supporting device according to claim 1, wherein a spring constant of the plate spring according to the optical axis direction of the optical element is smaller than a spring constant of the first supporting member.

3. The optical element supporting device according to claim 1, wherein the force supplying unit can adjust the magnitudes of the forces that are applied to the first supporting member and the plate spring.

4. The optical element supporting device according to claim 3, wherein the force supplying unit is an adjustment screw engaged with a tap formed in the first supporting member.

5. The optical element supporting device according to claim 3, wherein the force supplying unit is an actuator.

6. The optical element supporting device according to claim 1, wherein a plurality of the plate spring are fastened to the first supporting member at three evenly-spaced locations in the circumferential direction of the first supporting member.

7. The optical element supporting device according to claim 1, wherein the first supporting member supports the optical element with three first supports, the second supporting member supports the first supporting member with three second supports, and the first support and the second support are mutually out of phase.

8. The optical element supporting device according to claim 7, wherein the first support and the second support are arranged at an angle of 60 degrees with respect to each other.

9. The optical element supporting device according to claim 7, wherein the force supplying unit is arranged in the vicinity of the first support.

10. An optical system comprising the optical element supporting device according to claim 1.

11. An exposure apparatus comprising:
    an illumination optical system that illuminates a reticle with light emitted from a light source portion; and
    a projection optical system that guides light reflected from the reticle to a substrate,
    wherein at least one of the illumination optical system and the projection optical system has the optical element supporting device according to claim 1.

12. A device manufacturing method comprising the steps of:
    exposing a substrate using the exposure apparatus according to claim 11; and
    developing the substrate.

13. The optical element supporting device according to claim 1, wherein the force supplying unit is arranged in the same direction as the plurality of supports in the optical axis direction.

* * * * *